(12) United States Patent
Liou et al.

(10) Patent No.: US 7,125,793 B2
(45) Date of Patent: Oct. 24, 2006

(54) METHOD FOR FORMING AN OPENING FOR AN INTERCONNECT STRUCTURE IN A DIELECTRIC LAYER HAVING A PHOTOSENSITIVE MATERIAL

(75) Inventors: Huey-Chiang Liou, Fremont, CA (US); Wang Yueh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 10/746,485

(22) Filed: Dec. 23, 2003

(65) Prior Publication Data

US 2005/0133920 A1    Jun. 23, 2005

(51) Int. Cl.
*H01L 21/4763* (2006.01)
(52) U.S. Cl. .................. 438/637; 438/780; 438/781
(58) Field of Classification Search ............... None
See application file for complete search history.

(56) References Cited

U.S. PATENT DOCUMENTS 6,528,409 B1 * 3/2003 Lopatin et al. ............. 438/618

2002/0030297 A1 * 3/2002 Gallagher et al. .......... 264/49
2003/0004218 A1 * 1/2003 Allen et al. ................. 521/77

OTHER PUBLICATIONS

MaMe surface characterization, "Low-K Dielectrics," (undated), 2 pages, ITC irst, Centro Per La Ricerca Scientifica & Technologica.
Iawamoto, N. et al., "Studying Ultra Low K Dielectrics: Challenges and Solutions," Jun. 2002, 21 pages, Honeywell/SEMATECH, Star Center, Electronic Materials, Ultra Low k Workshop.

* cited by examiner

*Primary Examiner*—Thanh Nguyen
(74) *Attorney, Agent, or Firm*—Blakely, Sokoloff, Taylor & Zafman LLP (57) ABSTRACT

A method of forming an opening in a disclosed ILD is described. The ILD in one embodiment includes a matrix material and a photosensitive porogen. Hard sidewalls are formed in the ILD allowing a thin barrier layer to be used in a dual damascene copper and porous low-k without pore sealing steps.

15 Claims, 10 Drawing Sheets

METHOD FOR FORMING AN OPENING FOR AN INTERCONNECT STRUCTURE IN A DIELECTRIC LAYER HAVING A PHOTOSENSITIVE MATERIAL

FIELD OF THE INVENTION

The invention relates to the field of interconnect structures in integrated circuits including those fabricated using dual damascene processes.

PRIOR ART

In integrated circuits, speed is increased and power reduced by lowering the k of the dielectric materials separating conductive lines and vias. Often, the low-k dielectrics are porous, and consequently, mechanically weak. The porous materials have rough surfaces not suitable for receiving subsequent depositions in some cases.

Figure 1:
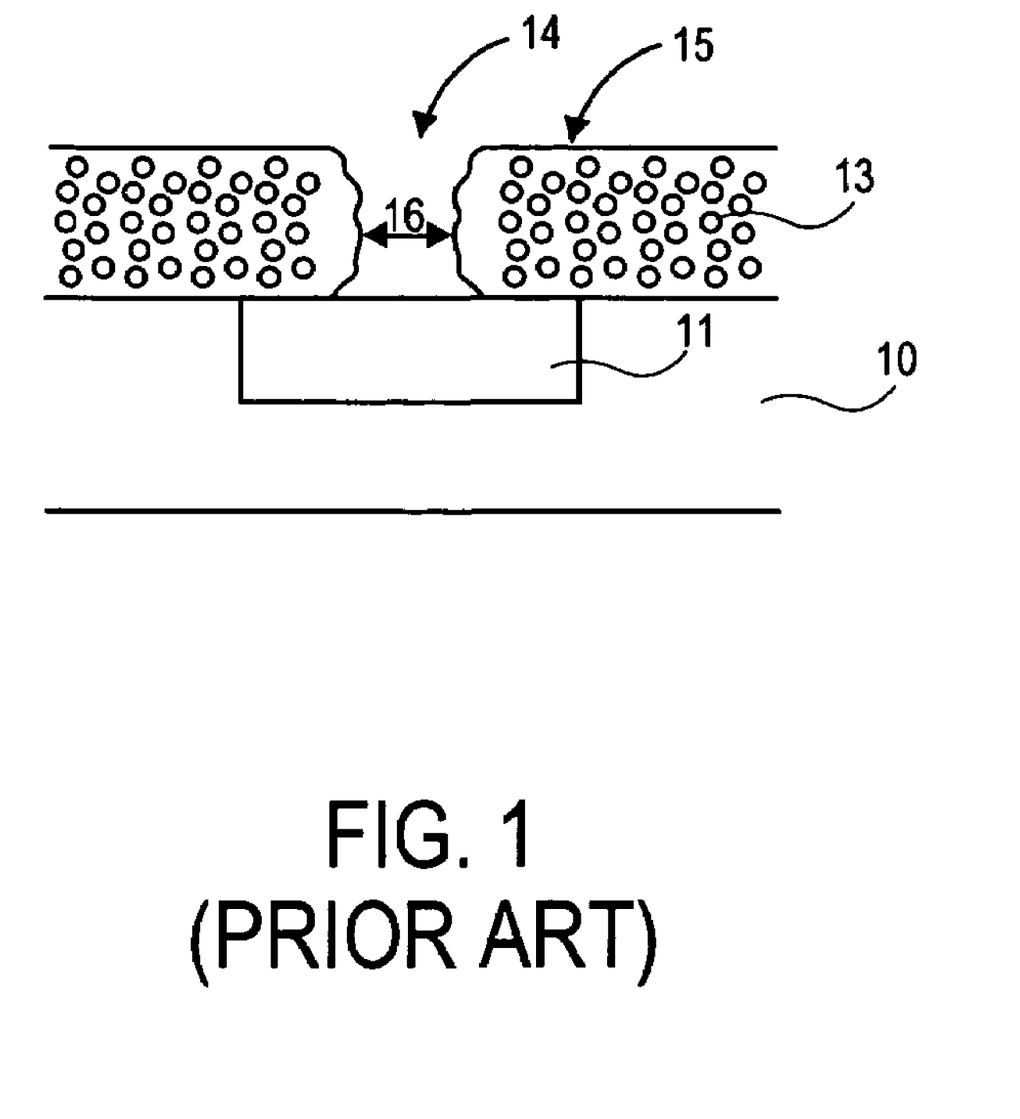
FIG. 1 is a cross sectional elevation view of an interconnect structure showing an opening formed with prior art processing.

FIG. 1 illustrates a typical interlayer dielectric layer (ILD) 10 having a conductor 11. A low-k dielectric layer 13 is formed on the ILD 10, and as can be seen, the layer 13 is porous. An opening 14 is etched through the layer 13 to expose the underlying conductor 11. When this is done, the sidewalls of the opening 14 are relatively rough, and consequently, it is difficult to deposit a thin barrier layer in the opening 14. Rather, what is often done, is first to form a sealing layer 15 on the walls of the opening 14 to provide a smoother surface for subsequent depositions and prevent the degradation of low-k materials attacked by chemicals used in subsequent steps. Numerous processing problems arise from the use of the sealing layer. For instance, the width of the opening 14 is decreased as shown by dimension 16 because of the sealing layer. This leaves less space for a via or conductor, and as a result, a higher resistance via or conductor is formed. Another problem is that the aspect ratio increases, making it more difficult to deposit or electroplate conductive materials into the opening 14. If the seal layer 15 is too thin, then it is unable to seal completely the pores 13. In addition, the pore size increases as k is reduced which makes it more difficult to completely seal the pores before the barrier deposition and copper electroplating.

Ideally, a thin barrier layer should be deposited directly into the opening (without a sealing layer) to leave ample space for a conductor or via. Small pore sizes with diameters less than 2 nm with no pores with diameters greater than 3 nm are most desirable. Moreover, the porous dielectric should not degrade when exposed to chemicals and gases during the via etching and cleaning processes.

BRIEF DESCRIPTION OF THE DRAWINGS

FIGS. 8, 9, and 10 illustrate alternate processing to the processing of FIGS. 2 and 3.

DETAILED DESCRIPTION

Processing to form an opening in an ILD, the formation of an interconnect structure in the opening, and the materials for the ILD are described. In the following description, specific details are set forth including specific materials and processing. It will be apparent to one skilled in the art that these details are not necessarily needed to practice the present invention. In other instances, well-known processing particularly those used in a dual damascene process are not set forth in detail, in order not to unnecessarily obscure the present invention.

Overview

A ILD is first formed over an underlying layer such as an interconnect layer. In one embodiment, the ILD comprises a radiation sensitive porogen and a matrix material. A region for an opening in the layer is photolithographically defined. The region is etched to form the opening. Typically, the opening is used to contact an underlying conductor or via. As used in this application, the opening includes via openings as well as trenches for conductors.

Where the porogen is a positive tone material, the ILD surrounding the region where the opening is etched is subjected to radiation. This disassociates the porogen in the ILD exposed to the radiation, which can be removed later and become a porous region, such that the region for the opening is a relatively harder ILD surrounded by a softer ILD. Where the porogen in the ILD is a negative tone material, the region itself is exposed to radiation and the surrounding region is unexposed. This again causes the region for the opening to be of a harder ILD, surrounded by a softer ILD material, from which the porogen can be removed later leaving a porous region. In both cases, after the region is etched, the resulting opening is surrounded by a relatively hard material with a porosity suitable for receiving a barrier layer.

After the etching and appropriate cleaning steps, the opening is lined with a barrier material such as tantalum or tantalum nitride. A relatively thin barrier layer may be formed because the dielectric surrounding the opening is relatively hard and not porous. Next, the opening is filled with a conductive material such as copper or a copper alloy. Following this, as is typically done, a chemical-mechanical polishing (CMP) process is use to planarize the upper surface of the ILD so that the barrier and conductive materials only remain in the opening.

Now, the dielectric is made porous, to reduce its k, in a post treatment process using e-beam or UV radiation, a thermal cycle, or chemically, for instance, with a photoresist stripper, water, or super critical $CO_2$. This effectively removes at least a portion of the porogen leaving a relatively porous low-k structure.

Several positive tone and negative tone porogens are described below along with materials for the matrix structure.

Processing for Forming an Opening for an Interconnect Structure

Figure 2:
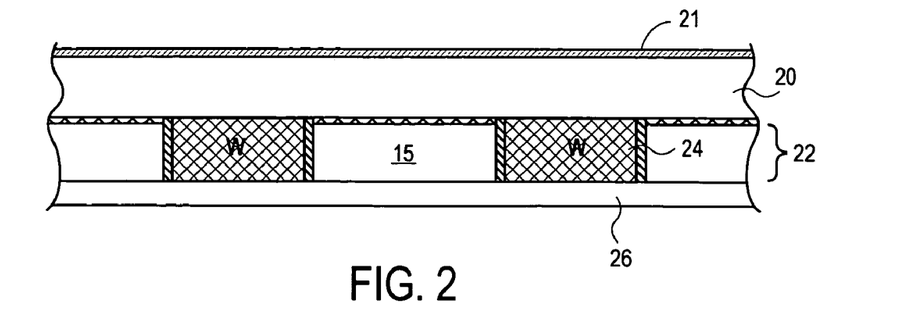
FIG. 2 is a cross sectional elevation view of an ILD formed on an underlying layer with a photoresist layer formed on the ILD. The ILD is formed and processed with one embodiment of the present invention.

In FIG. 2, an ILD 20 is shown which in one embodiment comprises a porogen and a matrix material. The porogen as described later is a photosensitive material, which may be either a positive tone or negative tone material. The layer 20 is covered with an antireflective coating (ARC) and a photoresist layer 21. The ILD 20 of FIG. 2 is formed on an interconnect layer 22 which includes a plurality of a tungsten plugs 24 separated by a dielectric 15. The tungsten plugs contact doped regions in a substrate 26. (This level is sometimes referred to as zero level ILD and the ILD 20 as "ILD1.") The processing described for the ILD layer 20 could also be used for a higher lever ILD (e.g., ILD6) fabricated on a underlying ILD (e.g., ILD5) which includes vias and conductors fabricated in a dual damascene process as described below.

In another embodiment below, the photosensitive porogen in the ILD 20 is a negative tone material. Consequently, the layer 20 is relatively hard after being exposed to radiation and curing and the unexposed region becomes somewhat softer (FIGS. 2 and 3A).

In another embodiment below, the photosensitive porogen in the ILD 20 is a positive tone material. Consequently, the layer 20 is relatively soft after being exposed to radiation and curing and the unexposed region becomes somewhat hard. (FIGS. 2 and 3B)

Figure 3A:
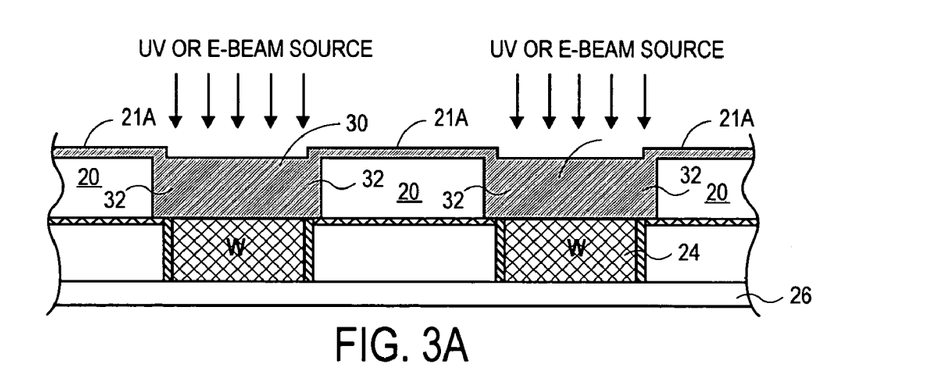
FIG. 3A illustrates the structure of FIG. 2 after masking and during exposure to radiation, where the ILD is a negative tone material.

First, the photoresist 21 is masked so as to form masking members 21a shown in FIG. 3A. This processing leaves exposed the ILD 20 above the tungsten contacts as shown in FIG. 3A. Now, the structure of FIG. 3A is subjected to ultraviolet or electron beam radiation. The masking members 21a protect the layer 20 deposited below these masking members from the radiation. For this reason, radiation is only shown in FIG. 3A in the regions where the masking member 21a is not present. The radiation defines the regions 30. Slight overexposure to the radiation may be needed, depending upon the composition of the layer 20, to assure complete exposure of the region 30. This may cause some hardening of the layer 30 after curing, under the edges of the masking members 21a as shown by the sidewall areas 32 in FIG. 3A. A high temperature curing or an annealing process is used, for instance, one hour at a temperature of 400° C. to cure the porogen in the ILD 20. This causes the regions 20 to become porous or softer than the remaining and surrounding regions of the layer 20 which were protected by the masking members 21a.

Figure 3B:
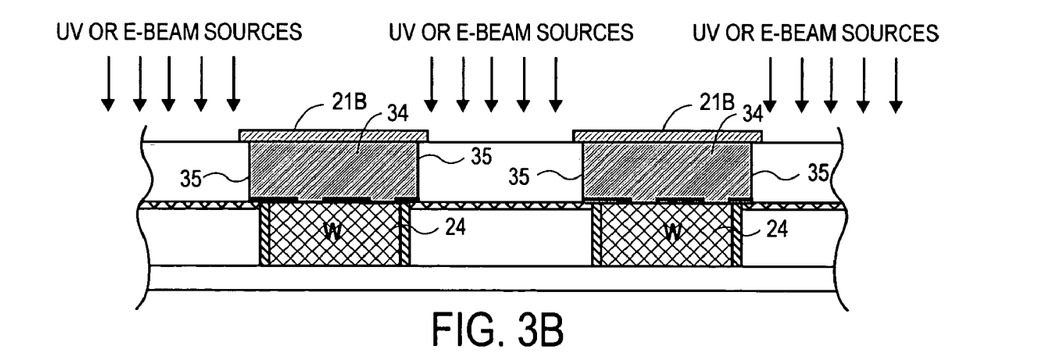
FIG. 3B illustrates the structure of FIG. 2 after masking and during exposure to radiation, where the ILD is a positive tone material.

FIG. 3B illustrates the case where the layer 20 includes a positive tone porogen. This layer is typically porous or soft if exposed and harder once exposed to radiation and cured. Here, the masking layer 21 is formed into masking members 21b, which protect the regions of the layer 20 disposed above the plugs 24. Once again, the layer 20 is exposed to either ultraviolet or e-beam radiation, and this time the regions of the layer 20 over the plugs 24 remain unexposed and the regions of the layer 20 surrounding the regions 34 are exposed to the radiation. This causes the regions 34 to remain relatively harder after curing while the regions surrounding the regions 34 become softer due to the radiation. Underexposure may be needed, depending upon the porogen used. When this occurs, the sidewalls of the region 34 under the edges of the masking members 21b such as shown by sidewalls 35, will be solid.

Figure 4:
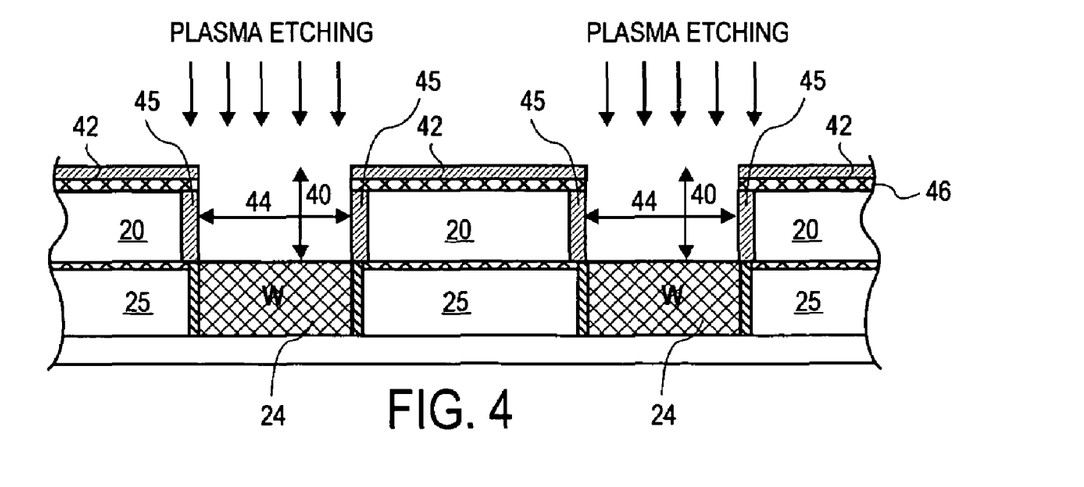
FIG. 4 illustrates the structure of FIG. 3A and FIG. 3B during a plasma etching step.

Next, as shown in FIG. 4, a plasma etching step is used to remove the solid regions of layer 20, thereby allowing the plugs 24 to be exposed. Another etching and photoresist layer 42 is used to form the masking members 46, which define the opening 40. Layer 46 may be a hard masking material used as an etchant stop in subsequent processing such as a silicon nitride layer.

In the case of the negative tone photoresist, the dimension 44 defined by the masking members 46, will be slightly larger than the corresponding distance between the masking members 21a of FIG. 3A. This is to compensate for the overexposure, resulting in the solid sidewalls 32. And in contrast, where the porogen of layer 20 is a negative tone material, the dimension 44 will be slightly smaller than the corresponding width of the masking members 21b of FIG. 3B. Note, the sidewalls 35 of FIG. 3B, due to the underexposure, become relatively hard.

Consequently, the plasma etching of FIG. 4, etches the harder regions of the layer 20. The sidewalls of the opening 40 are lined with relatively hard regions of layer 20 for both a positive tone or negative tone porogen. The relatively hard, non-porous, sidewalls lining the openings 40 are shown as sidewalls 45 in FIG. 4 to point out that the openings are lined with this hard material. This is significant since it allows the formation of a relatively thin barrier material on these sidewalls.

Figure 5:
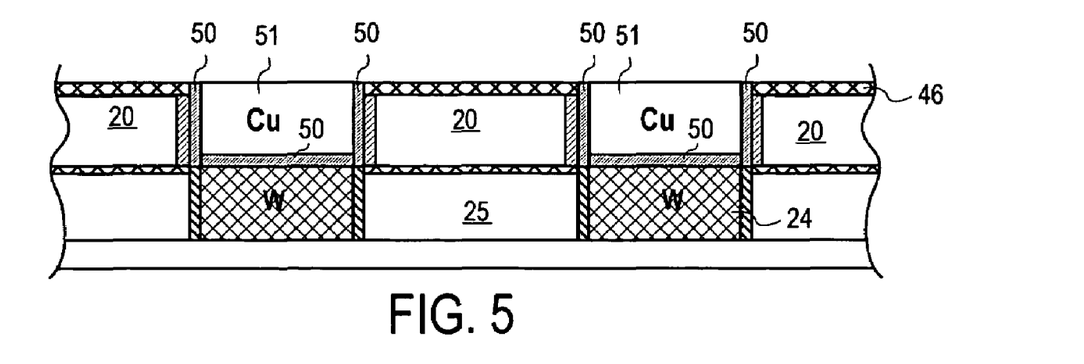
FIG. 5 illustrates the structure of FIG. 4 after the formation of a barrier layer, a copper interconnect material, and after planarization.

As shown in FIG. 5, the openings 40 are lined with a relatively thin barrier layer 50. This barrier layer often is formed from tantalum or tantalum nitride. After the formation of the barrier layer, conductive material such as copper or a copper alloy is formed on the barrier layer. This forms the interconnect structure, in this case, the vias 51. CMP is used to remove the excess material from the surface of the hard mask 46 resulting from the deposition of the barrier layer and the conductive material 51. This is not shown in FIG. 5.

Figure 6:
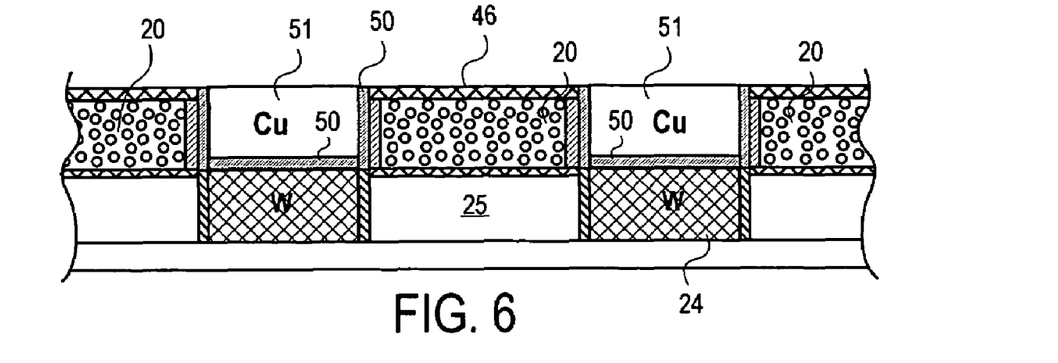
FIG. 6 illustrates the structure of FIG. 5 after the ILD is made porous.

Now, the structure of FIG. 5 and in particular the remaining portions of the layer 20 are treated, so as to make porous the relatively softer layer 20. This causes the layer 20 to become a porous low-k dielectric. It may include exposure to an e-beam, ultraviolet radiation, a thermal cycle or chemical bathing in a photoresist stripper, water, or supercritical $CO_2$ depending upon the porogen. As shown in FIG. 6, this results in a low-k dielectric between the vias 51. The vias 51 are formed in the opening having relatively solid sidewalls providing self aligned via sealing.

Figure 7:
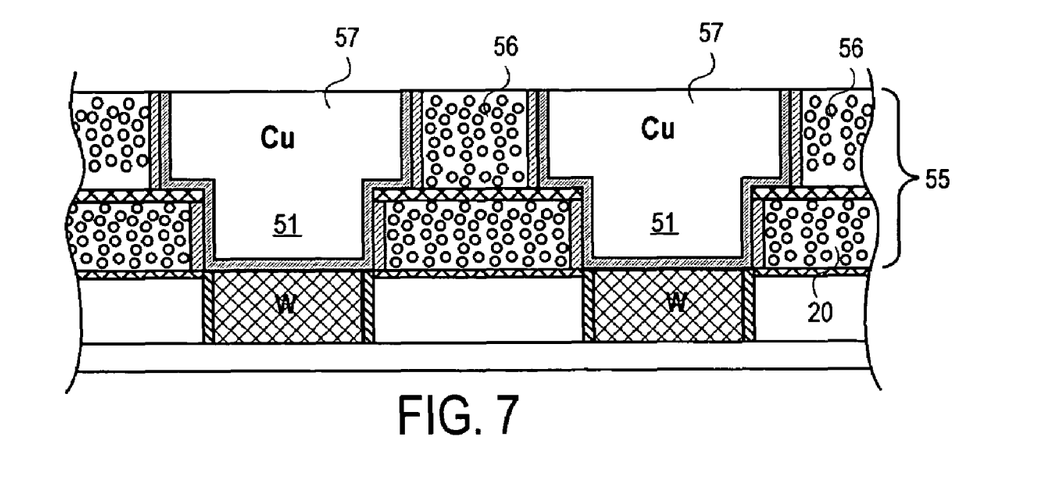
FIG. 7 illustrates the structure of FIG. 6 after an additional level of ILD is formed with conductors as part of a dual damascene process.

The processing described above for FIGS. 2–6 can be repeated for a porous dielectric layer 56, allowing the conductors 57 to be formed overlying the vias 51. This results in a full level of an interconnect structure 55 formed in a dual damascene process as shown in FIG. 7. The openings that are etched in layer 56 are trenches for the conductors 57.

FIGS. 8, 9A, 9B and 10 describe alternate masking to the masking shown in FIGS. 2, 3A, 3B and 4.

Figure 8:
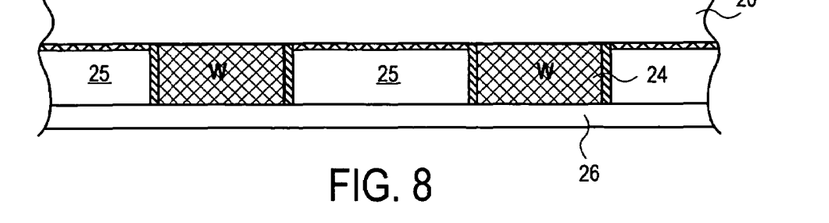
FIG. 8 illustrates a cross sectional elevation view of an ILD formed on an underlying layer as taught by another embodiment of the present invention.
Figure 9A:
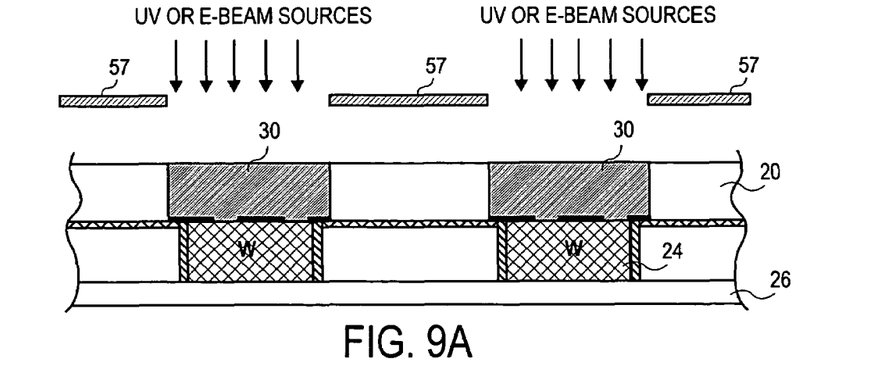
FIG. 9A illustrates the structure of FIG. 8 during selective exposure to radiation where the ILD of FIG. 8 is a negative tone material.

In FIG. 8, the structure of FIG. 2 has been repeated, however, there is no photoresist layer 21 formed on the upper surface of the ILD 20. A mask 57 disposed above the upper surface of the ILD 20 is used to expose the regions of the ILD 20 as shown in FIG. 9A. This is the case where the ILD comprises a negative tone porogen. Consequently, the regions 30 are defined by the mask 57 rather than the masking members 21b of FIG. 3A. Otherwise, the processing is the same. Again, overexposure may be needed to form the regions 30 depending upon the porogen used.

Figure 9B:
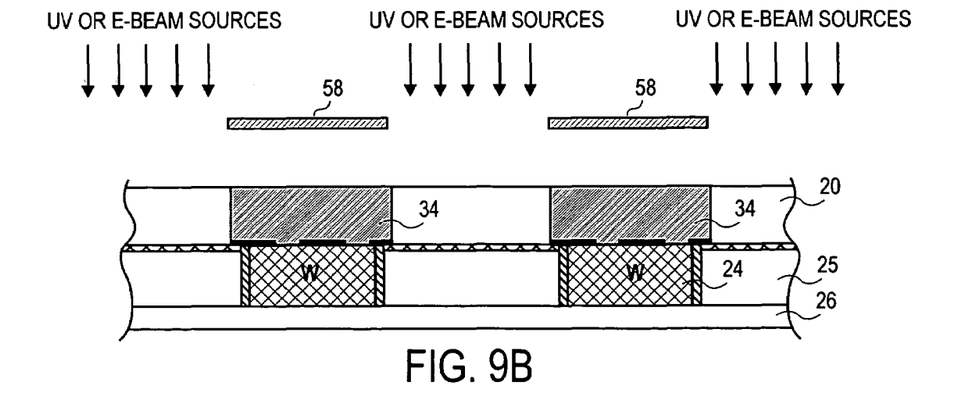
FIG. 9B illustrates the structure of FIG. 8 during selective exposure to radiation where the ILD of FIG. 8 is a positive tone material.

FIG. 9B corresponds to FIG. 3B except that for FIG. 9B instead of masking members 21b being formed on the surface of the dielectric, a mask 58 is used to expose the regions 34 of the ILD 20. This is the case where the ILD 20 comprises a positive tone porogen.

After exposure of the dielectric layer 20 of FIGS. 9A and 9B the layer is cured. Now a layer of photoresist 47 is spun onto the wafer.

Figure 10:
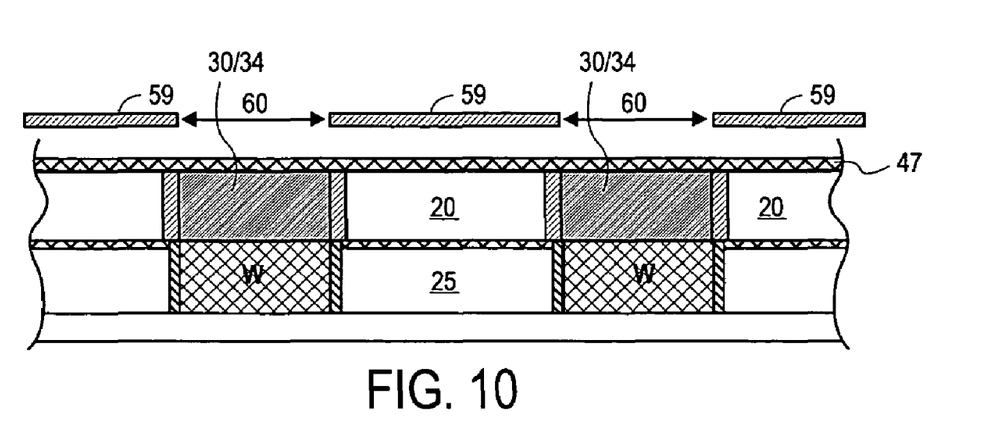
FIG. 10 illustrates the structure of FIGS. 9A and 9B during masking.

FIG. 10 illustrates that the layer 47 is exposed by a mask 59. This is in contrast to, for example, the previous discussed embodiment where the photoresist layer 42 was formed on the hard masking layer 46. The dimension 60 of FIG. 10 corresponds to the dimension 44 of FIG. 4, and depending on whether a positive or negative tone porogen is used this dimension is different from the dimension used to form the regions 30 or 34 as discussed above for dimension 44.

Following the processing shown in FIG. 10, plasma etching is again used, as shown in FIG. 4, except that the masking layer 46 is not present. Next as shown in FIG. 5, the formation of the barrier layer and conductive material occurs as described above.

Composition of the Photosensitive ILD

As mentioned earlier, the ILD may comprise a matrix material and a photosensitive material. The photosensitive material is stripped leaving the matrix in place in one of several processes discussed above, as it typically is for a photoresist. The relative proportions of a matrix material and, for instance, a porogen can vary widely. For example, the ILD can comprise 1% matrix at 99% porogen. After stripping the resultant ILD will have a very low-k, approaching one. Alternatively, the matrix material can comprise 99% of the ILD and the porogen 1% of the ILD. Here, after stripping, the k will be substantially that of the matrix material.

Figure 11A:
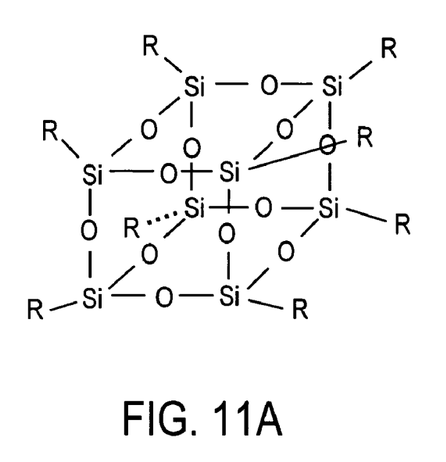
FIG. 11A illustrates the molecular structure of a case structure matrix material used in the ILD.
Figure 11B:
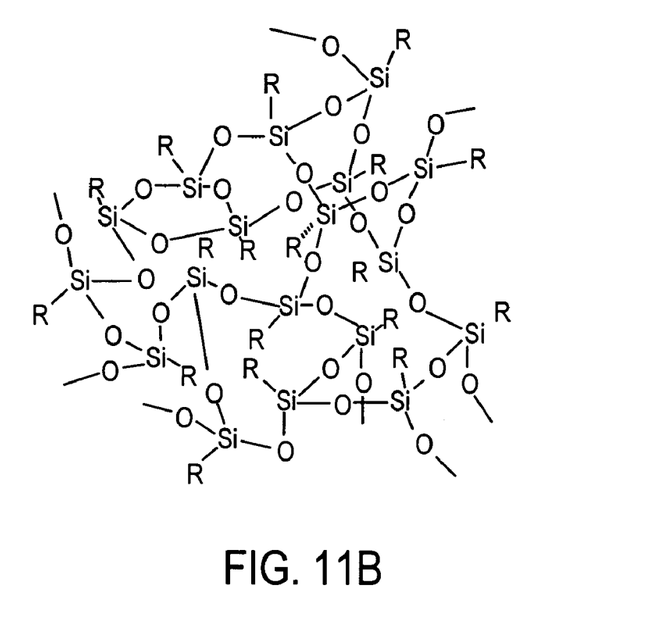
FIG. 11B illustrates the molecular structure of a ladder structure matrix material used in the ILD.

Examples of matrix materials are shown in FIGS. 11A and 11B. Both these materials are silicon based, specifically silsesquioxane materials. In FIG. 11A, a case structure silsesquioxane is illustrated while in FIG. B, a ladder structure silsesquioxane is illustrated.

The matrix material may be mixed with a positive tone or negative tone porogen and spun onto the wafer. It is then cured and exposed as described above.

Where in FIG. 11 "R" is hydrogen, the silsesquioxane is HSQ, a material commercially available from Dow Corning. "R" may also be methyl ($CH_3$). This material is commercially available as MSQ. A combination of hydrogen and methyl may be used for "R," this material is available from Honeywell as HOSP.

Figure 12:
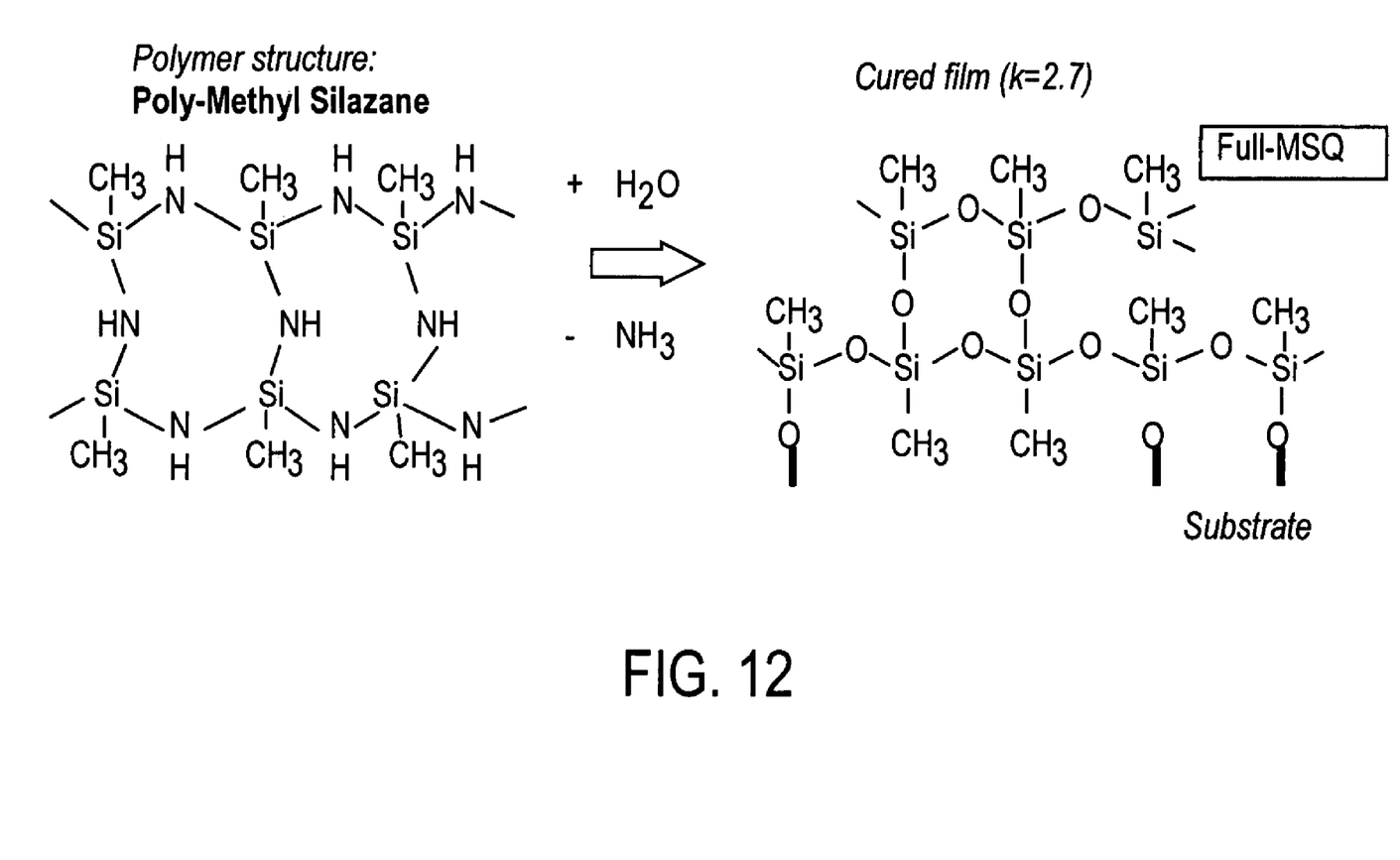
FIG. 12 illustrates the transition for a positive tone porogen resulting from curing.

FIG. 12 illustrates a positive tone porogen (photoresist in this case), which may be used. This material is a poly-methyl silazane in a polymer structure, commercially available from Clariant. It is cured with the addition of moisture and the out gassing of ammonia to become methyl silsesquioxane (MSQ) in the matrix material of FIG. 1. In its cured state, the MSQ is relatively hard and as discussed above, the region for the opening is exposed to the radiation to soften it leaving the via area harder and more etchable.

Figure 13:
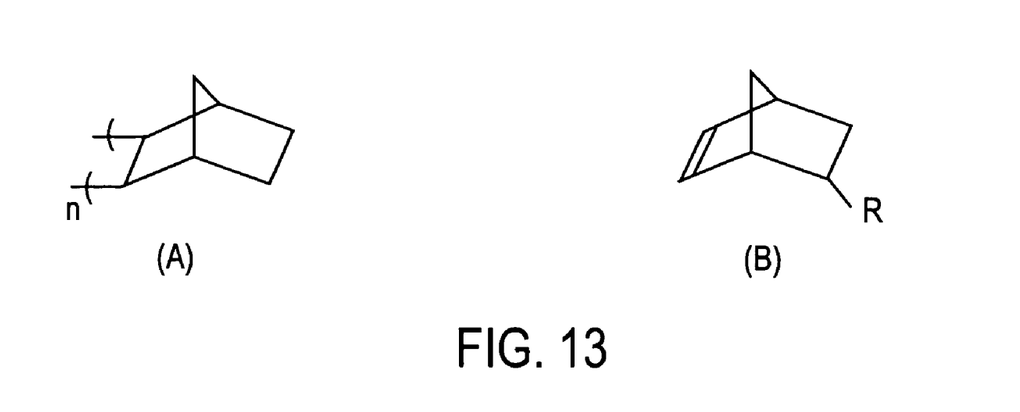
FIG. 13A illustrates the molecular structure a negative tone porogen material.
FIG. 13B illustrates the molecular structure for another negative tone porogen material.

Two closely related negative tone porogens are shown in FIGS. 13A and 13B. In FIG. 13A, a polynorbornene material which may be thermally decomposed to remove it from the matrix material is illustrated. In FIG. 13B a polyacetylene-polynorbornene material is shown. This block-copolymer is a photosensitive thermally decomposable material. These materials are available under the trademark Promerus.

Figure 14:
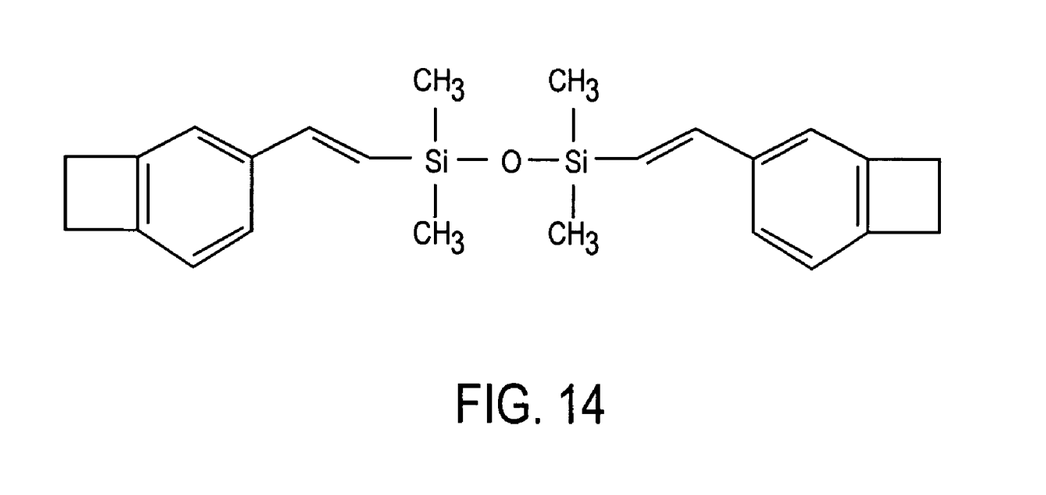
FIG. 14 illustrates the molecular structure for a negative tone porogen materials comprising a BCB monomer.

Another porogen shown in FIG. 14, is a photosensitive BCB monomer available from Dow Chemical. This is a negative tone of porogen.

Figure 15:
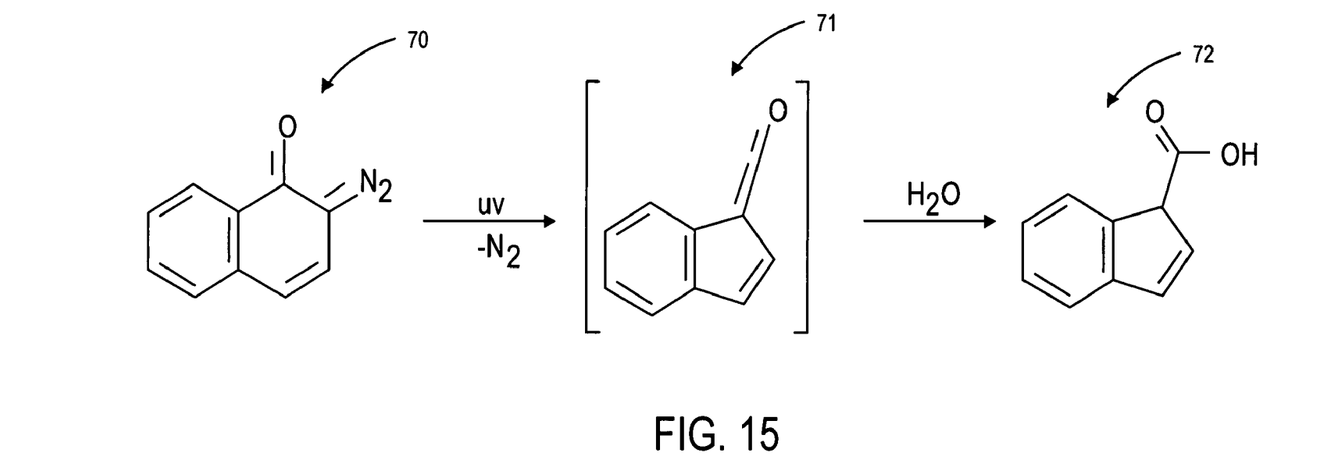
FIG. 15 illustrates the transition of a photo acid compound used with MSQ, HSQ, or other low-k matrix materials.

The molecule 70 shown in FIG. 15 is used to provide a photo acid compound (PCD) when incorporated into the matrix material of FIG. 1 along with photoresist having a backbone matrix (e.g. MSQ molecules). Specifically, this compound is DNQ-Diazonaphthoquinone, which may be used with MSQ, HSQ or other low-k matrix material. As shown at 71, after exposed to UV, this positive tone porogen gives off nitrogen and becomes a softer material. It is stripped as shown by the molecule 72 with water. DNQ is commercially available as DNQ-Novolic resist.

Figure 16:
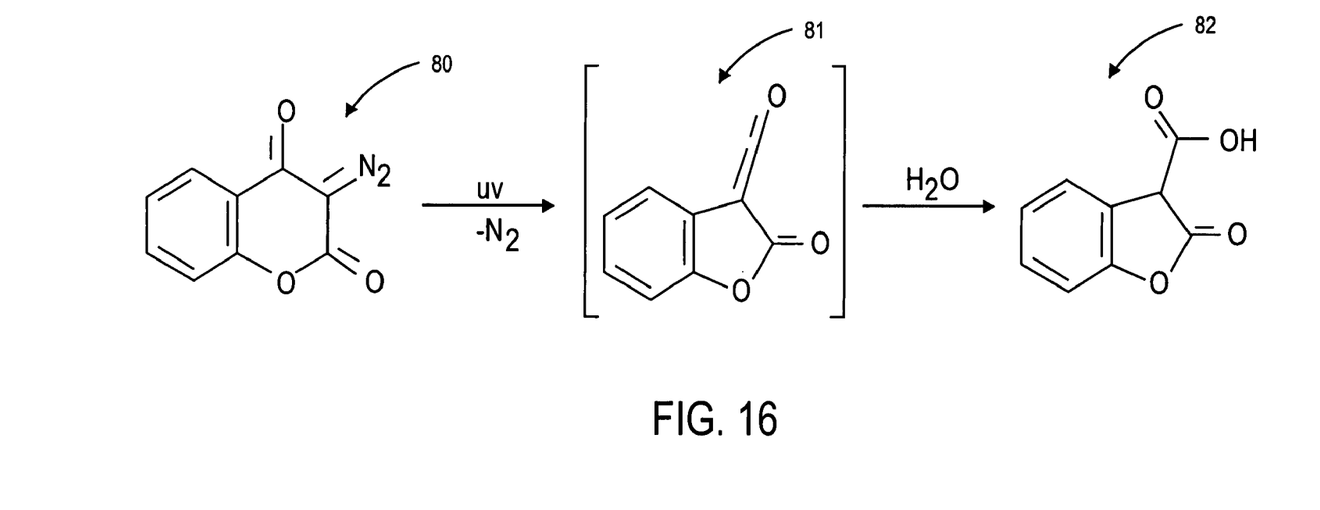
FIG. 16 illustrates another photo acid compound used with MSQ, HSQ, or other low-k matrix materials.

FIG. 16 illustrates a similar PCD which may be spun on with a matrix material, such as MSQ, HSQ or other low-k matrix material along with the photoresist backbone matrix molecule to provide a positive tone photoresist. Molecule 80 is somewhat similar to molecule 70 except for the additional oxygen atoms. Once exposed to ultraviolet radiation, it becomes a softer material shown by molecule 81. This molecule is stripped with the use of water as shown by molecule 82.

Thus, a method of forming an opening in a novel ILD has been described.

What is claimed is:

1. A method for forming an opening for an interconnect structure comprising:
   depositing a dielectric layer having a photosensitive dielectric material;
   selectively subjecting the dielectric layer to radiation;
   curing the dielectric to define in the dielectric layer a region of a harder dielectric material adjacent a softer dielectric material in response to the selective subjecting of the dielectric layer to radiation; and
   etching an opening in the region having sidewalls of the harder dielectric material.

2. The method of claim 1 wherein the dielectric material comprises a matrix material and photosensitive porogen or components.

3. The method defined by claim 2 including, removing at least a part of the porogen or components after the etching of the opening.

4. The method defined by claim 3 including, forming a porous hard mask layer to allow the porogen material to be removed with post-treatment thereby forming a porous low-k dielectric after removal of the porogen.

5. The method defined by claim 3 including, forming a barrier layer in the opening before removing the porogen.

6. The method defined by claim 5 including, forming a conductive material on the barrier layer thereby forming an interconnect structure.

7. The method defined by claim 6 wherein the interconnect structure is a via contacting an underlying conductor or doped region.

8. The method defined by claim 6 wherein the interconnect structure is a conductor contacting an underlying via.

9. The method defined by claim 2 wherein the matrix material comprises a silsesquioxane material.

10. The method defined by claim 9 wherein the silsesquioxane material includes hydrogen or methyl as the R.

11. The method defined by claim 9 wherein the porogen is a polynorbornene.

12. The method defined by claim 9 wherein the porogen is a BCB monomer.

13. A method for forming an opening for an interconnect structure comprising:
   depositing a dielectric layer comprising a matrix material and a negative tone porogen;
   defining a first regionin a layer by exposing it to radiation;
   leaving the exposed dielectric layer such that the first region is surrounded by a harder dielectric material as a result of the exposing the first region to radiation;
   etching the first region with a mastk which defines an opening larger than the first region, thereby forming sidewalls in the opening of an unexposed second region of the dielectric layer.

14. The method defined by claim 13 including, depositing a barrier material in the opening.

15. The method of claim 14 including, forming a conductive material on the barrier layer filling the opening.

* * * * *

UNITED STATES PATENT AND TRADEMARK OFFICE
CERTIFICATE OF CORRECTION

PATENT NO. : 7,125,793 B2 Page 1 of 1
APPLICATION NO. : 10/746485
DATED : October 24, 2006
INVENTOR(S) : Liou et al.

It is certified that error appears in the above-identified patent and that said Letters Patent is hereby corrected as shown below:

In column 8, at line 7, after "first" delete "regionin" insert --region in--.

Signed and Sealed this

Tenth Day of April, 2007

JON W. DUDAS
*Director of the United States Patent and Trademark Office*